United States Patent [19]
Gamand et al.

[11] Patent Number: 5,021,759
[45] Date of Patent: Jun. 4, 1991

[54] PACKAGE FOR VERY HIGH FREQUENCY INTEGRATED CIRCUITS

[75] Inventors: Patrice Gamand, Yerres; Jean-Christophe Meunier, Limeil-Brevannes, both of France

[73] Assignee: U.S. Philips Corp., New York, N.Y.

[21] Appl. No.: 492,707

[22] Filed: Mar. 12, 1990

[30] Foreign Application Priority Data

Mar. 17, 1989 [FR] France ................. 89 03522

[51] Int. Cl.$^5$ .................................. H01P 1/00
[52] U.S. Cl. ................. 333/246; 333/247; 357/74
[58] Field of Search ............. 333/246, 247; 357/74

[56] References Cited

U.S. PATENT DOCUMENTS

| | | | |
|---|---|---|---|
| 3,943,469 | 3/1976 | Kawamoto et al. | 333/247 |
| 4,259,684 | 3/1981 | Dean et al. | 333/247 X |
| 4,768,004 | 8/1988 | Wilson | 333/247 X |
| 4,881,764 | 7/1989 | Usui | 333/247 X |

*Primary Examiner*—Paul Gensler
*Attorney, Agent, or Firm*—Steven R. Biren

[57] ABSTRACT

Package for a very high frequency integrated circuit comprising a housing provided with a recess whose bottom is metallized and provided with peripheral connectors, and including a connection device inserted in the recess between the integrated circuit and the connectors, this connection device including a substrate that presents an upper surface comprising microstrip lines to connect contact studs of the integrated circuit to the connectors of the housing and a metallized lower surface to form a ground plane. The housing comprises two parts fastened to each other, the first or peripheral part accommodating the connectors, a first zone of the connection device and a chamber provided in the recess, of which chamber the dimensions are independent of those of the integrated circuit to be protected, and which is suitable for accommodating, the second or central part, the latter accommodating the integrated circuit and a second zone of the connection device termed complementary zone, whose dimensions depend on those of the integrated circuit to be protected, so as to come as near to the latter as possible, in a manner such that the length of the connector wires between the microstrip lines and the studs of the integrated circuit is the smallest possible.

20 Claims, 6 Drawing Sheets

PACKAGE FOR VERY HIGH FREQUENCY INTEGRATED CIRCUITS

BACKGROUND OF THE INVENTION

The invention relates to a package comprising a housing provided with a recess whose bottom is metallized, and including connectors arranged along the periphery of the recess, and including a connection device inserted in the recess between the integrated circuit and the connectors, this connection device including a substrate that presents an upper surface comprising microstrip lines to connect contact studs of the integrated circuit to the connectors of the housing and a metallized lower surface to form a ground plane.

The invention finds its application in the domain of very high frequency integrated circuits where the frequency of the signals is situated between 30 and 60 GHz.

To date the integrated circuits operating at such high frequencies have come to witness an important development. They can only be marketed when comprising a package arranged for not reducing their performance. Now it applies that, to be more exact, technological progress concerning very high frequency integrated circuits has been faster in the research centers than in the industrial development centers to such an extent that packages capable of accommodating such integrated circuits are not yet found to be marketed having the indispensable performance.

For this purpose, it is good to recall that packages already existing for very high frequency circuits cannot be used in the domain from 1 to 6 GHz, or also packages for digital integrated circuits, neither can then be unreservedly transposed in order to be used in a domain where the frequency is of the order of 10 times higher. For that matter, the technical problems occurring in the 30–60 GHz frequency domain are extremely specific.

Thus, from European Patent Application No. EP 88202608.1 is known a package for digital integrated circuits. This package comprises a housing provided with a recess to accommodate the integrated circuit and contact studs disposed on the housing along the periphery of the recess. This package further comprises a connection device lying in the recess of the housing. This connection device is constituted by a wafer of alumina, itself provided with a central opening to receive the integrated circuit, and carries on its upper surface microstrip lines having an impedance of 50 Ω, in addition to resistors and capacitors arranged radially extending from the edge of the central opening near to the integrated circuit along the periphery near to the recess in the housing. This connection device is also provided with a ground plane disposed on its lower surface to make contact with a ground plane disposed on the bottom of the recess in the package.

In order to connect a ground stud of the integrated circuit to the ground plane of the package, a ground line surrounds the substrate layer through the recess, which causes the distance to be very long for this connection.

This restricts the use of such a system to a frequency domain which is smaller by an order of magnitude than the frequency domain searched for the application of the present invention.

Alternatively, once the integrated circuit and the connection device are in position, each microstrip line having an impedance of 50 Ω is connected by a short wire to a stud of the housing which wire is extended by a metallic stripline printed on the housing and which line surrounds this housing through the recess to reach its lower surface. This stripline which constitutes the connection device with the circuits on the outside of the package, is thus a simple conductor and not a connector of a given impedance of 50 Ω. The package is of the type without pins.

This also restricts the use of such a package for low-frequency integrated circuits or digital circuits, and does not enable to attain the high frequencies searched for the present applications.

Moreover, the housing of this package is of a resin which does not allow of realizing the screening necessary for the operation at the required frequencies. Finally, in the above document, nothing is observed about matters of sealing nor about matters of heat dissipation.

The technical problems posed by the realization of packages for integrated circuits operating at such high levels as 30–60 GHz or over, are the following:

This package is to present at least one line having the given impedance of for example 50 Ω connecting a very high frequency input or output of the integrated circuit to a connector of the coaxial type having a corresponding impedance, this connection line in fact being a very high frequency (VHF) line over its entire length;

This package is thus to present along its periphery at least one such coaxial connector to establish this connection;

This package is also to present standard connectors located along its periphery and lines for connecting these connectors to d.c. power supply studs of the integrated circuit;

This package is to present a ground plane without discontinuities;

This package is to constitute a screening, be tight, be able to withstand temperatures from −40° to +125° C.;

This package is further to be manufactured in an easy manner and at low cost.

For this purpose it is to be able to accommodate integrated circuits of any dimension without substantial modifications of its structure.

SUMMARY OF THE INVENTION

According to the present invention, these problems are resolved by means of a package as described in the preamble and furthermore characterized in that the housing comprises two parts fastened to each other, the first part termed peripheral part accommodating the connectors, a first zone of the connection device and a chamber provided in the recess, of which chamber the dimensions are independent of those of the integrated circuit to be protected, and which is suitable for accommodating, more specifically, the second part termed central part of the housing, the latter accommodating the integrated circuit and a second zone of the connection device termed complementary zone, whose dimensions depend on those of the integrated circuit to be protected, so as to come as near to the latter as possible, in a manner such that the length of the connecting wires between the microstrip lines and the studs of the integrated circuit is the smallest possible.

The advantage obtained by means of this package is that the first part of the housing can be manufactured in very large series, thus at low cost, because it does not depend on the particular integrated circuit to be protected, whereas the central part is manufactured in smaller series because each series is specifically adapted to the dimensions of the particular integrated circuit to be protected. But this central part consists of a housing part of a particularly simple form in which only one characteristic feature is changed with the admission of each particular integrated circuit.

In this manner a good compromise is obtained between the reduction of manufacturing costs and the excellence of the quality required for using high frequency integrated circuits, because the connection wires between microstrip lines and studs have always a minimum length whatever the circuit accommodated by the package.

In an embodiment of the invention this package is further characterized in that the first and second parts of the housing comprise assembly means for restoring an uninterrupted ground plane under the assembly of the first and second zones of the connection device, so as to avoid forming discontinuities that constitute VHF resonance cavities.

An advantage presented by this package is thus that the ground plane of the connection device is absolutely uninterrupted and that the resonance phenomena which could occur as a result of the fact that the housing is realized in two parts, during the assembling of these two parts, are carefully avoided.

In a particular embodiment of the invention, this housing is characterized in that the assembling means include:

on one hand the place of the first zone of the connection device recessed with respect to the edge of the chamber, and also a metallic layer located between the ground plane of this first zone and the bottom of the metallized recess, this metallic layer being bevelled between the border of the first zone and the border of the chamber;

on the other the place of the complementary zone of the connection device overhanging with respect to the border of the central part of the housing, this overhang having a magnitude virtually equal to the dimension of the recessed portion of the first part, and also a metallic layer of the same thickness as above, located between the ground plane of the so-called complementary zone of the connection device and the bottom of the metallized recess, this metallic layer being bevelled between the border of said complementary zone and the border of said central part of the housing; in that these means further include these metallic layers thus located forming a sealing of these zones of the connection device at their respective parts of the housing at said positions, and in that these means also include the contact of the two housing parts via the surfaces on top of each other of the bevelled zones, having a complementary slope of said metallic layers, and also in that the two parts of the housing are fastened to each other in order to maintain the continuity of the ground plane formed by said metallic layers.

The advantage realized by this implementation is that assembling the two parts of the housing is simple, and the proper contact of the two parts of the ground plane necessary for avoiding discontinuities generating resonance is particularly effective.

In a particular embodiment this package is characterized in that the fastening of the two parts of the housing is effected by means of at least one screw fastening the bottom of the chamber provided in the first part of the housing to the central part of the housing located in this chamber.

The advantage procured by means of this link is that it is very simple and inexpensive, and the electric contact of one ground plane to the next is perfect.

In a particular embodiment this package is characterized in that the head of the screw is covered by a resin flush with the bottom of the housing.

The advantage is thus that the housing is sealed.

In a particular embodiment this package is characterized in that it is metallic.

The advantage of this is that it allows performance to be maintained between −40° C. and +125° C. and assures a very good heat dissipation.

In a variant of the latter implementation this package is characterized in that it is formed of a metallized plastic material.

The particular advantage obtained with this variant is that the package is less costly.

In these embodiments the VHF screening of the circuit is obtained.

In a preferred embodiment the substrate of the connection device is alumina ($Al_2O_3$) of which the lower surface carries a ground plane, for example, deposited by means of a gold layer, and in that the metallic layer which is inserted between the parts of the connection device and their respective housing parts is a layer of InPb alloy which also effects the sealing between the respective parts and assures the continuity of the ground plane via the contact of its bevelled areas having complementary slopes.

In these conditions this sealing withstands the temperatures from −40° to +125° C., and the ground plane is also in electric contact with the screening of the package.

In an embodiment this package is characterized in that the peripheral connectors comprise at least one VHF connector of the coaxial type and having a specific impedance, and in that the connection device comprises at least one microstrip line having the same impedance, connecting a stud of the integrated circuit to said connector.

The advantage procured is thus that the constituted VHF line has the desired impedance over its entire length. Like in the device referred to by way of state of the art, there are no connectors for VHF microstrip lines which are not themselves VHF connectors having the desired impedance.

In a particular embodiment this package is characterized in that, in order to obtain VHF lines having a given impedance, the substrate of the connection device has a thickness that is a function of the width of the microstrip line and the operating frequency of the integrated circuit, the VHF line being constituted by three layers superimposed on the ground plane, on the material of the substrate and on the metallic strip disposed on the surface of this substrate.

The advantage is that, when influencing the thickness of the substrate, one may not only obtain VHF lines having the desired impedance, but having this impedance at very high frequencies, exceeding 40 GHz.

In a particular embodiment this package is characterized in that it comprises a number of 1 to 4 VHF coaxial connectors having an impedance of 50 Ω, and a corresponding number of microstrip lines having the same impedance, to connect studs of the integrated circuit to said connectors, the VHF lines further being located with respect to each other in a manner such that parasitic coupling is avoided.

This embodiment presents the advantage of being able to allow a greater part of the known types of VHF circuits: amplifiers, oscillators, mixers, phase shifters and more complex ensembles combining these circuits.

In a particular embodiment, this package is characterized in that it comprises one or a plurality of connectors and a corresponding plurality of stripline conductors on the surface of the connection device to connect studs of the integrated circuit to d.c. power supply sources.

In a preferred embodiment, this package is characterized in that these connectors for d.c. power supply are of the coaxial type and disposed along the periphery of the package in zones remote from VHF connectors.

In such an embodiment the package may be rectangular while the VHF connectors are located on parallel sides and the d.c. connectors on the other parallel sides.

In these conditions, the d.c. power supplies do not disturb the VHF signals which sometimes present a considerably less strong amplitude.

In a particular embodiment this package is characterized in that d.c. decoupling capacitors are inserted between the connectors for the d.c. voltage and the respective stripline conductors for the d.c. power supply.

In these conditions the package allows of d.c. decoupling of the power supplies.

In a preferred embodiment the coaxial connectors are constituted by a core isolated from the metallic or metallized package by a glass bead sealed to the package, for example, by means of an InPb alloy.

Such a sealing is not only hermetic but withstands the temperatures mentioned hereinbefore.

In such an embodiment the decoupling capacitors will preferably be formed by the succession of a first metallic layer, a dielectric layer and a second metallic layer, the first metallic layer being fixed to the metallic or metallized package forming the ground potential, and the second metallic layer being connected by short and thin wires to the ends nearest to the conductor lines for d.c. power supply sources.

Such an embodiment presents the advantage that it allows the use of commercial standard decoupling capacitors having larger values and being more suitable for the envisaged use than if they were deposited on the connection device implementing the method known from the state of the art mentioned above.

In an embodiment the central part of the housing accommodating the integrated circuit comprises on its surface a MESA to accommodate this integrated circuit which MESA has a transverse dimension equal to that of the integrated circuit, so that the upper surface of the integrated circuit is flush with the upper surface of the connection device, so as to enable the connection between the ends of the microstrip lines and microstrip conductors, and the corresponding studs of the integrated circuit by means of extremely short thin wires.

In this embodiment the various connections are particularly optimized. It is the transverse dimension of this MESA that varies from one integrated circuit to the next and sometimes it is its thickness. It is evident that this adjustment does not cause consequent additional cost during the realization of the central part of the housing.

In an embodiment this package is characterized in that it comprises a cover which is fastened to the housing in a sealed manner.

BRIEF DESCRIPTION OF THE DRAWING

The invention will be better understood by means of the following description illustrated by the appended drawing Figures, in which:

FIG. 1a represents in a basic configuration the housing of the package according to the invention in a cross-sectional view along the axis XX' of FIG. 2a;

FIG. 1b represents in a basic diagram the housing of the package according to the invention in a cross-sectional view along the axis YY' of FIG. 2a;

DETAILED DESCRIPTION OF THE INVENTION

Figure 1A:
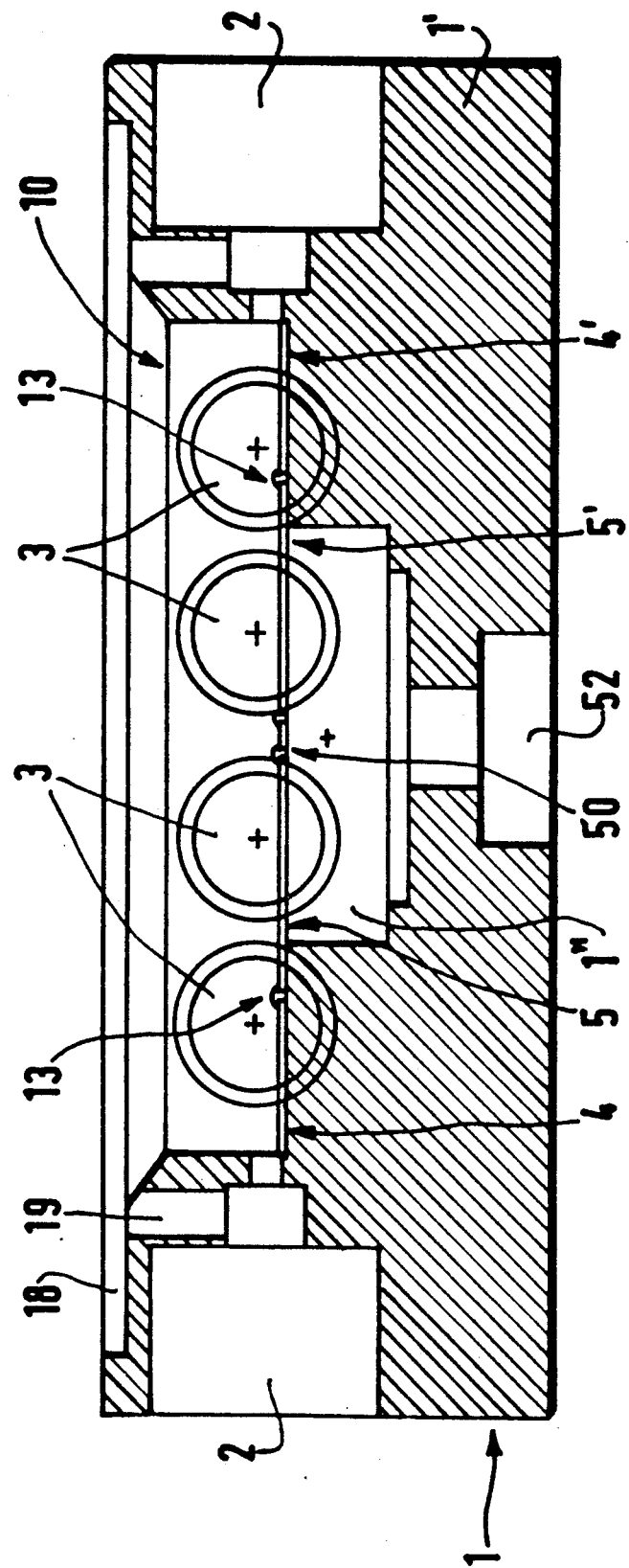
Figure 1B:
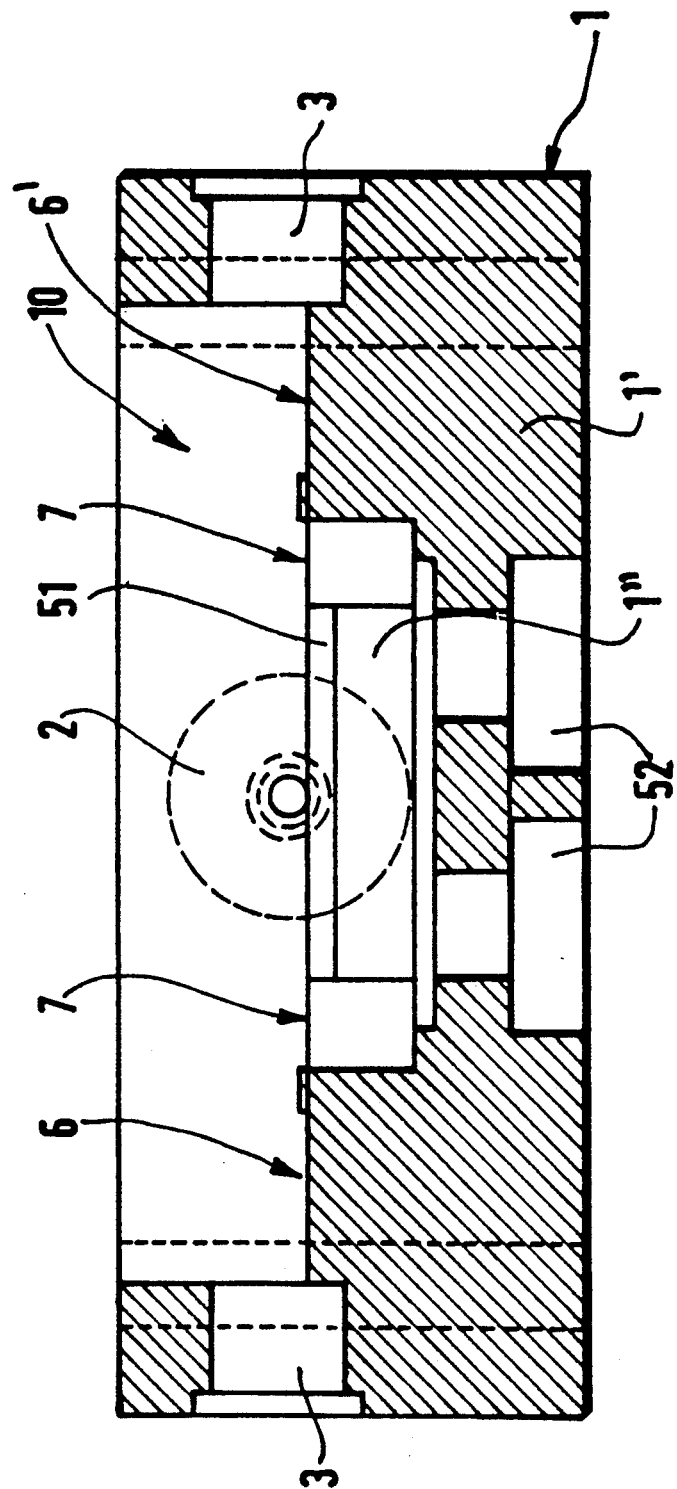

As is represented in cross-sectional views of the basic configuration in FIGS. 1a and 1b, the package for the VHF circuit according to invention first has a housing 1 provided with a recess 10 and peripheral connectors 2 and 3 arranged around the recess.

Figure 2A:
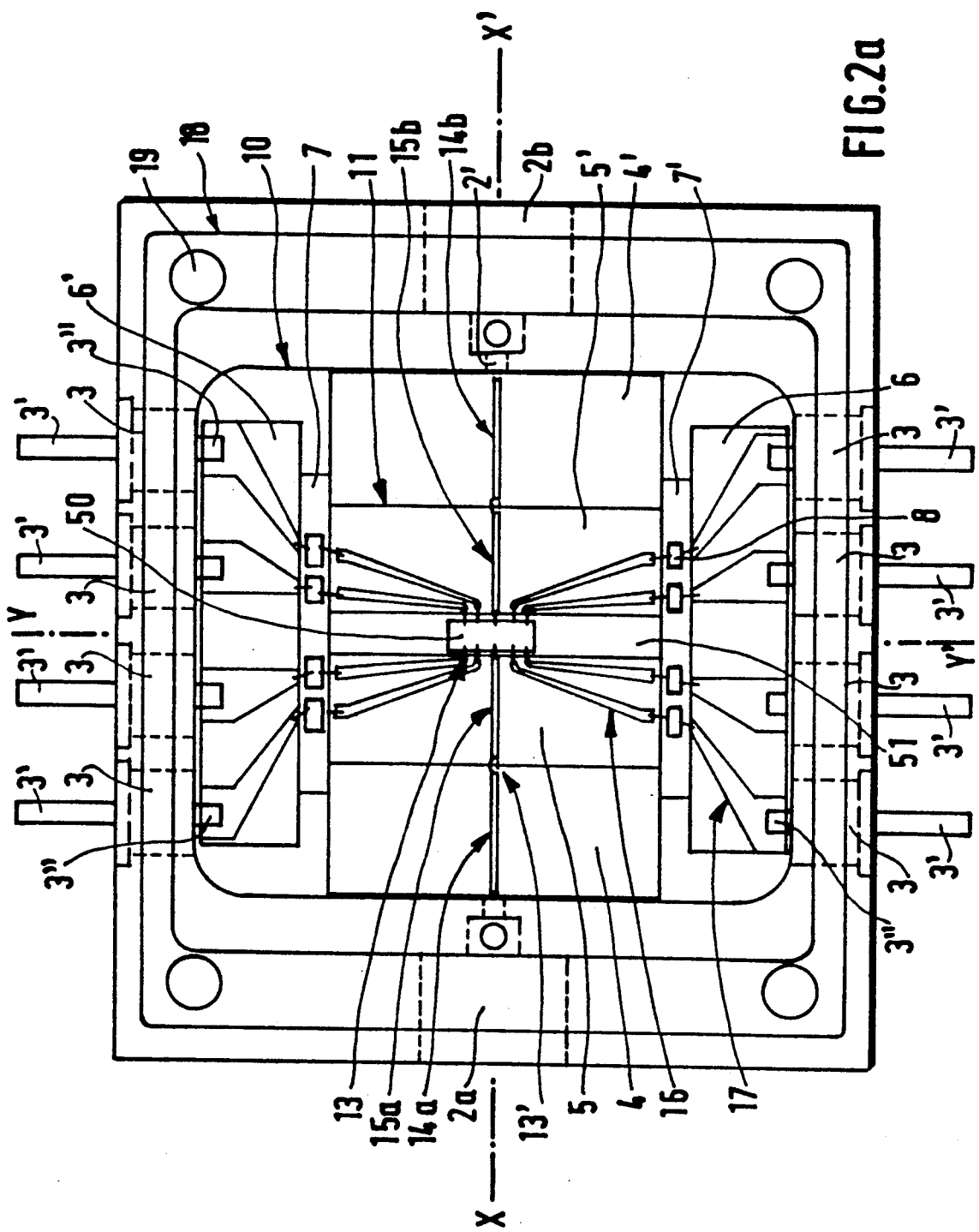
FIG. 2a represents in a basic configuration a top plan view of the package in the case in which it has 2 VHF connectors and FIG. 2b in the case in which it has 4 VHF connectors.
Figure 2B:
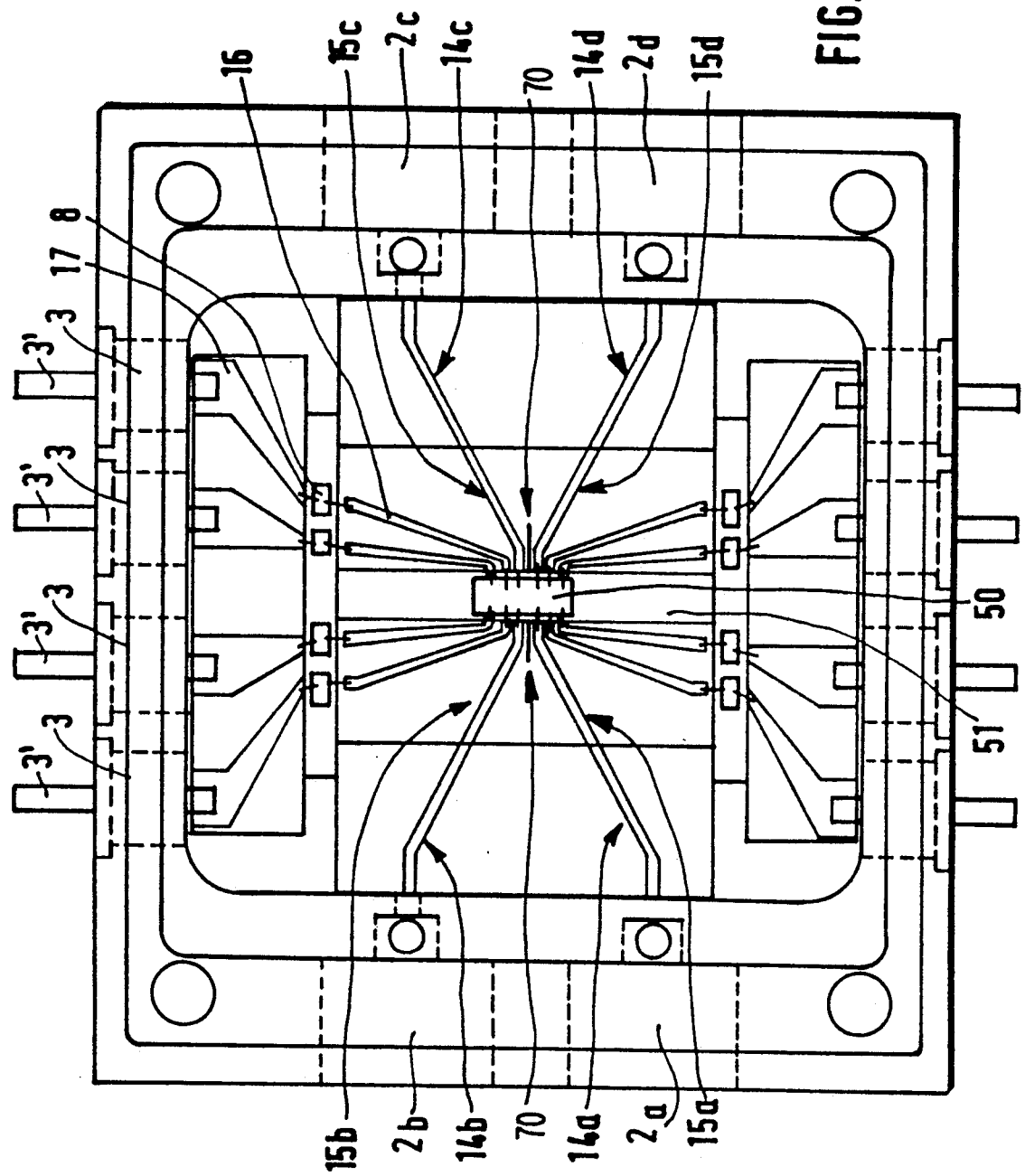

The FIGS. 2a and 2b show in top plan view that a VHF integrated circuit 50 is located in the center of the recess and that its various input/output studs 20/30 (cf. FIG. 3) are connected to the peripheral connectors 2,3 of the package by means of a connection device. This connection device comprises at least a substrate formed by parts 4, 4', 5, 5' and 6, 6' of a dielectric or semi-insulating material, which includes microstrip lines deposited on its upper surface and a ground plane 12 deposited on its lower surface (see FIG. 3). The material of the substrate may be alumina ($Al_2O_3$) if it is chosen to be dielectric, a III/V compound if it is chosen to be semi-insulating or also silicon. It may also be made of a dielectric, semi-insulating or semi-conducting material compatible with the very high frequencies.

There are two types of peripheral connectors. On one hand there are VHF connectors 2 and on the other connectors 3 for feeding the d.c. supply voltages. The VHF connectors are of the coaxial type having a specific impedance and are connected to the stud of the integrated circuit 50 by VHF lines 14, 15 having the same impedance. For this purpose the VHF lines are constituted by metallic strips deposited on the surface of the connection device and whose width is a function of the substrate material, of the thickness of the material and of the operating frequency f of the integrated circuit. Short and thin wires 13 then connect the ends of the metallic strips to the VHF studs of the integrated circuit. On the other hand, the core 2' of the coaxial connectors rests on the other end of these metallic strips to realize the VHF connection.

In order to attain very high frequencies (30 to 100 GHz) these wires 13 also have to be as short and thin as possible. The connection device deposited on the substrate 4, 4', 5, 5', 6 and 6' is thus to be disposed as close around the integrated circuit 50 as possible.

On the other hand, the package according to the invention is provided to house any type of integrated circuit, such as mixers, electric oscillators, or amplifiers, which have different dimensions.

In order to preserve the performance of an integrated circuit operating at frequencies as high as 30 to 100 GHz, the package itself has to show a very good performance, thus has to be costly. So it is advantageous to manufacture them as much as possible on a large scale. This is in contradistinction to the fact that it has to be specific of each circuit, because this again leads to manufacturing on a smaller scale.

According to the invention a compromise has been found by manufacturing the housing in two parts. A first part has universal characteristic features which can be used for any type of integrated circuit and manufactured on a large scale. And a second part is better adapted to each integrated circuit and manufactured on a smaller scale specific of these integrated circuits, but enables it to preserve the very good performance.

Figure 3:
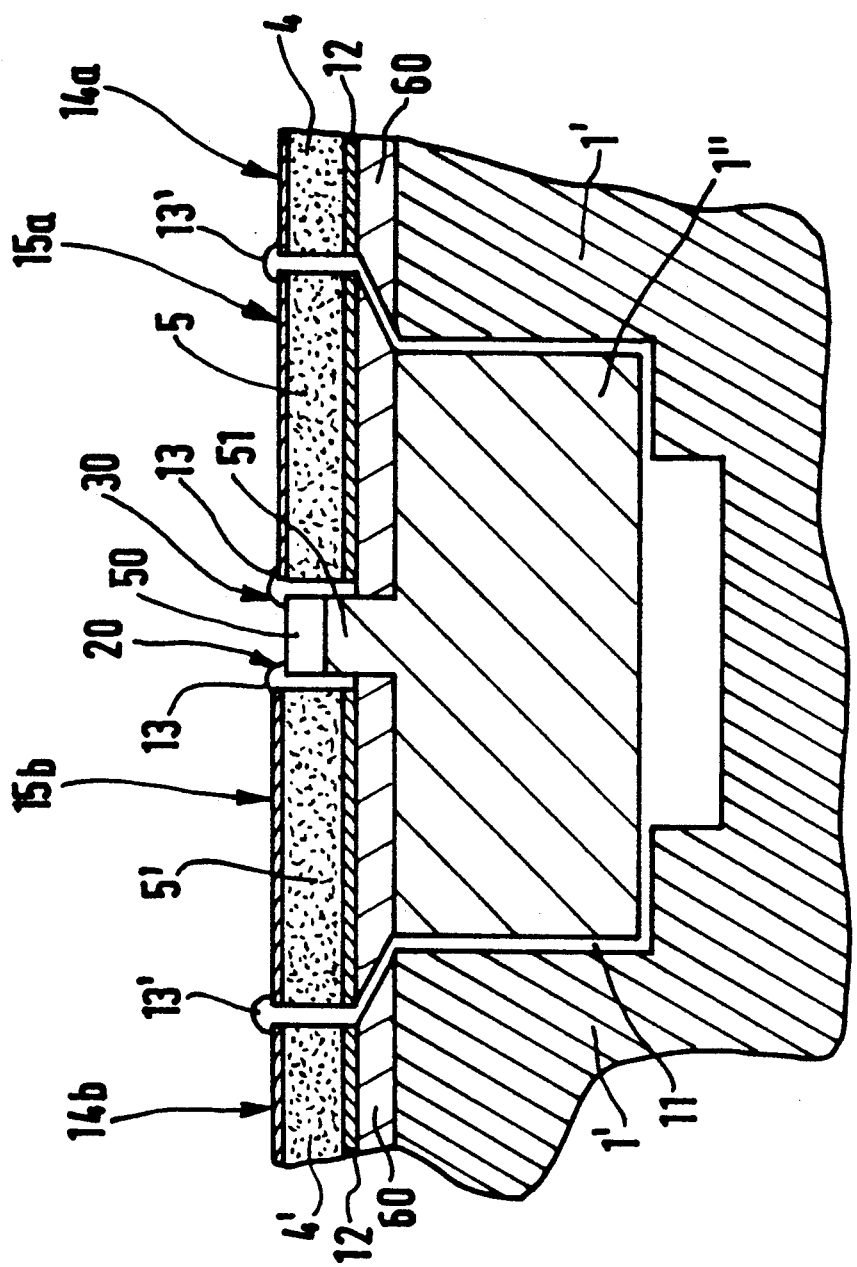
FIG. 3 represents in a basic configuration in a cross-sectional view the central part of the housing enlarged to show the assembly means of the two parts of the housing.

In effect, and as shown partly in top plan view in the FIGS. 2a and 2b, and partly in a cross-sectional view in the FIGS. 1a, 1b and 3, the housing comprises a first part 1' called peripheral part and a second part 1" called central part.

The peripheral part 1' of the housing accommodates:

the VHF connectors 2 of which, for example, a plurality from one to four (in these cases references 2a, 2b, 2c, 2d in the top plan views of the FIGS. 2a and 2b) may occur;

the connectors 3 for d.c. power supply of which, for example, a plurality of eight (see the top plan views of FIGS. 2a and 2b) may occur which are located so as to be remote from the VHF connectors, and which are also preferably coaxial connectors;

the first zones of the connection device located along the periphery of recess 10. On one hand the zones 4 and 4' are found which accommodate VHF line sections 14 (optionally 14a, 14b, 14c, 14d according to the number of VHF connectors). The zones 4 and 4' are located nearest to the VHF connectors so that the connection between the ends of the VHF lines 14 and the core of the VHF coaxial connectors 2 can be established by bringing them into contact with each other, as has already been observed. One also finds the zones 6 and 6' accommodating the line sections 17 of which, for example, a plurality of eight may occur according to the number of connectors 3 for the d.c. zones. The zones 6 and 6' are located such that the core 3' of the connectors 3 comes into the vicinity of the line sections 17 so that the connection between the core 3' of said connectors and the end of the line 17 is also achieved by bringing them into contact with each other.

The peripheral part 1' of the housing also comprises a chamber 11 disposed in the center of the recess 10 and in a manner such as to be surrounded by said first zones 4, 4' and 6, 6' of the connection device.

The dimensions of this chamber 11 are independent of those of the integrated circuit 50 to be protected. It is intended to accommodate more precisely the second part 1" or central part of the housing.

The central part 1" of the housing accommodates:

the integrated circuit 50 preferably disposed on a MESA 51 so as to be able to be exactly on a level with the various parts of the connection device. This MESA 51 is constituted by a simple strip which rises above the surface of the central part 1" of the housing and is very easy to manufacture. It is made so as to have exactly the same transverse dimension as the integrated circuit 50 to be protected. Because of this the central part of the housing is specific to every different integrated circuit.

second zones 5 and 5' of the connection device disposed on either one of the two sides of the MESA 51 and nearest thereto. These zones 5 and 5' accommodate VHF line sections 15 disposed so as to ensure the continuity with the line sections 14 between the connectors 2 and the VHF input/output studs 20 of the integrated circuit (see FIG. 3). Said second zones 5 and 5' also accommodate lines 16 disposed so as to ensure the continuity with the d.c. power supply line sections 17 between the connectors 3 and the d.c. power supply studs 30 of the integrated circuit.

However, according to the invention, the two parts of the housing 1 and 1' have perfected assembly means. In effect, the VHF lines being constituted as observed hereinbefore by three substrate 4,4', 5, 5', layers of strip 14, 15 and by the ground plane 12, if a discontinuity in the ground plane occurs, for example if the electric contact between the different parts of the ground plane is simply made by the contact of the first part of the housing 1' and of the second part of the housing 1", the space 11' between these two parts of the housing forms a resonance cavity which distorts the VHF signal. Consequently, these assembling means are to allow restoring of an uninterrupted ground plane under the assembly of the first and second zones of the connection device so as to avoid forming such a discontinuity that constitutes a VHF resonance cavity.

According to the invention this problem may be resolved by using assembly means of the two housing parts according to the following system:

firstly, the first zone 4, 4' of the connection device shows a recess with respect to the border of the chamber 11. A metallic layer 60 is then formed between the ground plane 12 of the connection device 4, 4' and the bottom of the recess 10. The bottom of this recess 10 is either metallic or metallized. The metallic layer 60 is chosen from suitable alloys in order to form a sealing between the ground plane 12 and the metallized bottom of the recess 10. During this sealing a bevelled area is formed between the border of parts 4 and 4' of the connection device and the corresponding border of the housing 1' (see FIG. 3), secondly, said second zone 5, 5' of the connection device is arranged to overhang from the central part 1" of the housing. This overhang is made to a dimension which is essentially equal to the recess of the first zone 4, 4'. A metallic layer 60 is formed in the same manner as above between the connection device 5, 5' and the surface of the housing part 1" which is on a level with the bottom of the recess 10 already described and is metallized or metallic as described above. The sealing of the ground plane 12 of the parts 5, 5' is effected with this surface and on doing so a bevelled area is formed between the border of parts 5 and 5' of the connection device and the border of the central part of the housing 1". As is shown in FIG. 3 the slopes of the bevelled areas are complementary. Each of the regions 4, 4', 5, 5' of the connection device is sealed for the part of the housing at said positions. And the central part of the housing 1" is accommodated in the chamber 11 so that the bevelled areas having complementary slopes of the layers 60 or of the first and second parts of the connection device respectively, are brought into contact. Then part 1" is fixed to the part of the housing 1', for example, by means of a screw 52 or various screws, if necessary.

In these conditions the ground plane of the whole connection device is restored and does not show any discontinuity.

The chamber 11' which is formed between the peripheral part of the housing 1' and the central part of the housing 1" has thus no influence on the VHF signal. The parts 5 and 5' of the connection device and 4 and 4' of the connection device being provided to have such dimensions that the space left between them after assembly is very small, the connecting wires 13 between the lines 14a and 15a and the lines 14b and 15b are very short.

According to a particular embodiment of the invention the sealing layer 60 is an InPb alloy which permits sealing at a temperature of the order of 250°. Consequently, the package can then withstand operating temperatures ranging from −40° C. to +125° C.

In order to realize sealing by means of a screw, as is required in the manufacturing process of VHF packages, the head of the screw can be covered by a resin so that it is flush with the bottom of the housing 1'.

In order to attain very good performance at very high frequency, this package forms a shield, so it is preferably realized in a completely metallic version. However, since a metallic housing is very costly, it may also be realised in a metallized plastic version for a less heavy embodiment.

As has been said previously, in addition to the peripheral VHF connectors of coaxial type and specific impedance, the package according to the invention has also peripheral connectors of the coaxial type to lead to the integrated circuit d.c. supply voltages and the connection device has a number of corresponding conductor strips disposed on its surface to connect the d.c. supply voltage studs 30 of the integrated circuit 50 to the d.c. supply voltage connectors 3 of the package.

In a preferred embodiment these connectors for the d.c. power supply are disposed along the periphery of the package in the zones remote from the VHF connectors. For example, if the package is rectangular the VHF connectors may be located on parallel sides and the connectors for the d.c. voltage on the other parallel sides. In this condition the d.c. power supplies do not disturb the VHF signals which often have considerably lower amplitudes.

The FIGS. 2a and 2b show in a top plan view that the parts 5 and 5' are located on either one of the two sides of the integrated circuit 50 at a very small distance from the studs of this circuit so as to permit connection of the VHF lines 15a, 15b to the studs 20 of the integrated circuit by means of very thin minimum-length wires. These Figures also show that the parts 4 and 5, and 4' and 5' are very close together to interconnect the lines 14a, 15a and 14b, 15b by means of very thin short wires.

The d.c. power supply studs of the integrated circuit are connected to the d.c. connector 3 by means of conductors 16 and 17. Between the conductors 16 disposed on the parts 5 and 5' of the connection device located in the central part of the housing and the conductors 17 disposed in the parts 6 and 6' of the connection device located in the peripheral part of the housing, two metallic or metallized strips 7 and 7' may be reserved to allow decoupling capacitors 8 to be disposed. These strips 7 and 7' are carried by the part 1' of the housing. Preferably, the decoupling capacitors 8 are formed by a first plate of a dielectric layer and a second plate; the first plate may be sealed onto one of the metallic parts 7 or 7', the second plate then being connected by a short and thin wire to the conductor line 16 and also the conductor line 17.

On the other hand the connectors 2 and 3 are preferably formed by means of a glass bead sealed in a peripheral opening of the housing 1' and comprising a core used by the central conductor so that all the connectors 2 or 3 are coaxial connectors.

The metallic or metallized package is thus used as the ground potential for the coaxial conductor and the core of the coaxial conductor is to be connected to the strip of the upper part of the connection device. Therefore, the core of the coaxial conductor coincides with the conductors 14 for the connectors 2, and conductors 17 for the connectors 3 and rests on these conductors.

Finally, in order to seal this package, the housing may be provided with a cover. As is represented in FIG. 2a, in a top plan view, a recess 18 is provided in the surface of the housing to put the cover in place. On the other hand, screws 19 may be used to fix the cover to the housing In a further embodiment, the cover may be placed in the recess 18 by means of any sealing product known to those skilled in the art.

In this arrangement the package according to the invention constitutes for the VHF integrated circuit a sealed shield capable of withstanding temperatures from −40° to +125° and with which it is possible to take in or deliver the number of desired VHF signals with the desired impedances; and also to take in the d.c. supply voltages necessary for the operation of the circuit. FIG. 2b shows in a top plan view a variant of the housing of the package according to the invention in which one finds four VHF connectors instead of two VHF connectors shown in FIG. 2a. The VHF lines are thus disposed in a manner such that parasitic coupling of them is avoided.

In a VHF circuit the number of required VHF inputs/outputs seldom exceeds four, there are generally one to three. Therefore, in a preferred embodiment the package according to the invention presenting for example, four VHF inputs and eight connectors for d.c. supply voltages covers the range of most of the actually known VHF circuits.

In a preferred embodiment the substrate 4, 4', 5, 5' is an alumina $Al_2O_3$ substrate having a thickness of 254/μm and the lines 14a, 14b, 15a, 15b also have a thickness of 254 μm. The ground plane 12 of the substrate is made of gold (Au) and the housings of the package are made of copper, brass or aluminium. This substrate is sealed to the blocks 1' and 1" by means of the alloy InPb or any other alloy having the required properties. The length of the lines 14a, 15a and 14b, and 15b is 10 mm and the length of the lines 16 and 17 is 8.5 mm. In order to operate at higher frequencies an alumina substrate of half their thickness may be used.

It should be observed that the embodiment of said first zone of the substrate in various parts 4, 4' and 6, 6' on one hand enables assembly of two parts of the housing as has been discussed and on the other hand enables insertion of the d.c. decoupling capacitors 8. This embodiment also enables the number of VHF or d.c. power lines adapted to the circuit to be protected, without affecting the two parts 1' and 1" of the housing of the package.

The second zone of the substrate, subdivided into parts 5 and 5' to be adapted without much effort to the integrated circuit to be protected, may present the replacement of a VHF line section 15, by a tuning circuit (not shown) which enables compensation for the losses owing to small wires 13 for the frequencies higher than 60 GHz. Moreover, between the adjacent VHF lines such as 15a, 15b or 15c, 15d in the case in which the connection device comprises more than two VHF lines (see FIG. 2b), a small opening 70 may be realized in the substrate 5, 5' between the ends of said adjacent lines of the integrated circuit in order to diminish the parasitic coupling. A dimension of the opening perpendicular to the integrated circuit is to be less than a quarter of the wavelength of the signal frequency.

The d.c. microstrip lines and possibly the tuning circuits are realized with the substrate of the connection device implementing any comparable technique known to the expert; for example by means of a thin layer technique if the substrate is semi-insulating or semi-conducting, and by means of a technique commonly referred to as silk screen printing technique if the substrate is made of ceramic.

Figure 4:
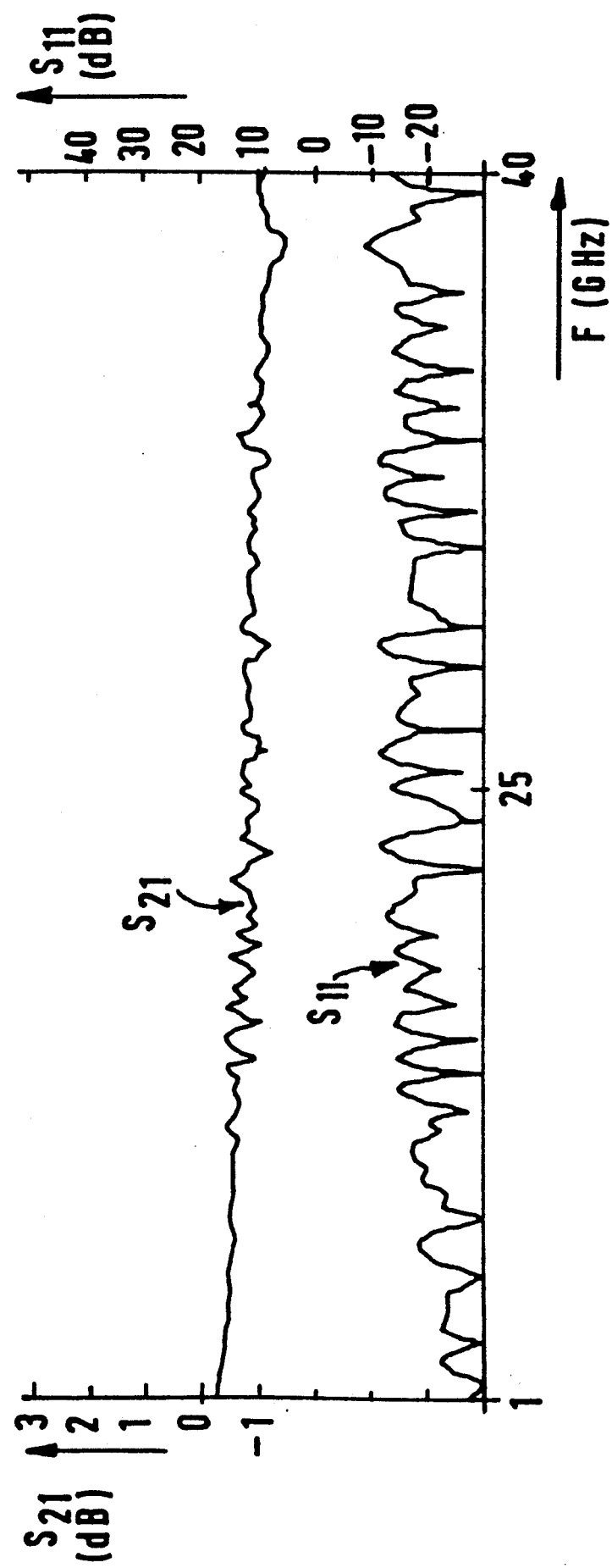
FIG. 4 represents the coefficients $S_{11}$ and $S_{21}$.

FIG. 4 represents the coefficients $S_{11}$ and $S_{21}$ of a VHF circuit formed by a package according to the invention comprising a positioned integrated circuit. The curve $S_{21}$ represents to the scale of 1 dB per unit, plotted against frequency in GHz, the transmission coefficient of this arrangement of a connector and a further connector, all the characteristic impedances of the lines and the VHF connectors being 50 Ω. The curve $S_{11}$ shows, to a scale of 10 dB per unit, plotted against frequency in GHz, the reflection coefficient of the same system.

Experiments have shown that the package according to the invention allows integrated circuits to operate at frequencies higher than 40 GHz and even up to 60 GHz. Experiments have further shown that a discontinuity in the ground plane 60, whereas the ground potential is realized by means of the package housing, results in a cut off frequency of the order of 20 GHz for the operation of the integrated circuit and results in that resonances and losses occur.

The small thin wires 13 may be realized by means of thermocompression binding.

We claim:

1. A package, for a VHF integrated circuit (50), comprising a housing (1) provided with a recess (10) whose bottom is metallized, and including peripheral connectors (2, 3), a connection device inserted in the recess between an integrated circuit and the connectors, the connection device including a substrate that presents an upper surface provided with microstrip lines (14, 15, 16, 17) to connect studs (20, 30) of the integrated circuit to the connectors (2, 3) of the housing and a metallized lower surface to form a ground plane (12), characterised in that:
    the housing comprises two parts fastened to each other, a first peripheral part (1') of the housing accommodating the connectors (2, 3), a first zone of the connection device (4, 4', 6, 6') and a chamber (11) provided in the recess (10), of which chamber (11) the dimensions are independent of those of the integrated circuit (50) to be protected, and which is suitable for accommodating a second central part (1") of the housing, the second central part of the housing accommodating the integrated circuit (50) and a second zone (5, 5') of the connection device complementary to the first zone, whose dimensions depend on those of the integrated circuit (50) to be protected, so as to be adjacent to the latter in a manner such that the length of the connecting wires (13) between the microstrip lines (15, 16) and the studs (20, 30) of the integrated circuit is minimized.

2. A package as claimed in claim 1, characterized in that the head of the screw (52) is covered by a resin flush with the bottom of the housing (1').

3. A package as claimed in claim 1, characterized in that the central part (1") of the housing accommodating the integrated circuit comprises on its surface a MESA (51) to accommodate this integrated circuit which MESA has a transverse dimension equal to that of the integrated circuit, so that the upper surface of the integrated circuit (50) is flush with the upper surface of the connection device (5, 5'), so as to enable the connection between the integrated circuit and the ends of the microstrip lines and conductor lines, respectively, by means of extremely short thin wires (13).

4. A package as claimed in claim 1, characterized in that it comprises a cover which is fastened to the housing in a sealed manner.

5. A package as claimed in claim 1, characterized in that the first and second parts (1, 1") of the housing (1) comprise assembly means for establishing an uninterrupted ground plane (12) during the assembly of the first (4, 4') and second (5, 5') zones of the connection device, so as to avoid forming discontinuities that constitute VHF resonance cavities.

6. A package as claimed in claim 5, characterized in that the assembly means include:
    the position of the first zone (4, 4') of the connection device recessed with respect to the edge of the chamber (11), and also a metallic layer (60) located between the ground plane (12) of this first zone and the bottom of the metallized recess (10), this metallic layer (60) being bevelled between the border of the first zone (4, 4') and the border of the chamber;
    the position of the complementary zone (5, 5') of the connection device overhanging with respect to the border of the central part (1") of the housing, this overhang having a magnitude equal to the dimension of the recessed portion of the first part (4, 4'), and also a metallic layer (60) of the same thickness as above, located between the ground plane (12) of the complementary zone of the connection device and the bottom of the metallized recess (10) this metallic layer (60) being bevelled between the border of said complementary zone (5, 5') and the border of said central part (1") of the housing; and
    these metallic layers thus located forming a sealing of these zones of the connection device (4, 4', 5, 5') at their respective parts of the housing at said positions, and in that these means also include the contact of the two housing parts (1', 1") via the surfaces on top of each other of the bevelled zones having a complementary slope of said metallic layers (60) and also in that the two parts of the housing are fastened to each other in order to maintain the continuity of the ground plane formed by said metallic layers.

7. A package as claimed in claim 6, characterized in that the fastening of the two parts (1', 1") of the housing is effected by means of at least one screw (52) fastening the bottom of the chamber (11) provided in the first part (1') of the housing to the central part (1") of the housing located in this chamber (11).

8. A package as claimed in claim 7, characterized in that the package is metallic.

9. A package as claimed in claim 7, characterized in that the package is formed of a metallized plastic material.

10. A package as claimed in claim 8, characterized in that the substrate of the connection device (4, 4', 5, 5', 6, 6') is alumina ($Al_2O_3$) of which the lower surface carries a ground plane (12), and in that the metallic layer (60) which is inserted between the parts of the connection device and their respective housing parts is a layer of InPb alloy which also effects the sealing between the respective parts and assures the continuity of the ground plane (12) via the contact of its bevelled areas, having complementary slopes.

11. A package as claimed in claim 8, characterized in that the peripheral connectors (2, 3) comprise at least one VHF connector (2) of the coaxial type and having a specific impedance, and in that the connection device comprises at least one microstrip line (14, 15) having the same impedance, connecting a stud of the integrated circuit to said connector.

12. A package as claimed in claim 11, characterized in that the coaxial connectors (2, 3) are constituted by a core (2', 3') isolated from the metallic or metallized package (1) by a glass bead sealed to the package (1).

13. A package as claimed in claim 11, characterized in that the connection device (5, 5') comprises at least two VHF lines (15a, 15b), whose ends nearest to the integrated circuit are separated by a small recess (70) provided in the substrate of the connection device to avoid parasitic coupling of the signals transported over the two lines.

14. A package as claimed in claim 11, characterized in that in order to obtain VHF lines having a given impedance, this substrate of the connection device has a thickness that is a function of the width of the microstrip line and of the operating frequency of the integrated circuit, the VHF line being constituted by three layers superimposed on the ground plane (12), on the material of the substrate (4, 4', 5, 5') and on the metallic strip (14, 15) disposed on the surface of this substrate.

15. A package as claimed in claim 14, characterized in that the package comprises at least one VHF coaxial connector (2) having an impedance of 50 Ω, and a corresponding number of microstrip lines (14, 15) having the same impedance, to connect studs (20) of the integrated circuit to said connectors, the VHF lines further being located with respect to each other in a manner such that parasitic coupling is avoided.

16. A package as claimed in claim 11, characterized in that the package comprises at least one connector (3) and a corresponding number of stripline conductors (16, 17) on the surface of the connection device (5, 5', 6, 6') to connects studs (30) of the integrated circuit to d.c. power supply sources.

17. A package as claimed in claim 16, characterized in that every connector (3) for d.c. power supply is of the coaxial type and disposed along the periphery of the package in zones remote from VHF connectors (2).

18. A package as claimed in claim 17, characterized in that the package is quadrangular, the VHF connectors (2) being located on parallel sides and the d.c. connectors (3) on the other parallel sides.

19. A package as claimed in claim 16, characterized in that a capacitor (8) is inserted between two stripline conductor sections (16, 17) to form a d.c. power supply line disconnected from the integrated circuit.

20. A package as claimed in claim 19, characterized in that the decoupling capacitors (8) are formed by a succession of a first metallic layer, a dielectric layer and a second metallic layer, the first metallic layer being fixed to the metallic or metallized package (1) forming the ground potential, and the second metallic layer being connected by short and thin wires (13) to the ends nearest to the conductor line sections (16,17) for d.c. power supply sources.

* * * * *